United States Patent
Mitani et al.

(10) Patent No.: US 6,967,432 B2
(45) Date of Patent: *Nov. 22, 2005

(54) PIEZOELECTRIC SHEAR RESONATOR, COMPOSITE PIEZOELECTRIC SHEAR RESONATOR, AND PIEZOELECTRIC RESONATOR COMPONENT

(75) Inventors: Akihiro Mitani, Toyama-ken (JP); Hiroaki Kaida, Moriyama (JP)

(73) Assignee: Murata Manufacturing Co., Ltd., Kyoto (JP)

(*) Notice: Subject to any disclaimer, the term of this patent is extended or adjusted under 35 U.S.C. 154(b) by 193 days.

This patent is subject to a terminal disclaimer.

(21) Appl. No.: 10/307,289

(22) Filed: Dec. 2, 2002

(65) Prior Publication Data

US 2003/0122450 A1    Jul. 3, 2003

(30) Foreign Application Priority Data

Dec. 4, 2001   (JP) .......................... 2001-369790
Dec. 18, 2001  (JP) .......................... 2001-384444
Oct. 18, 2002  (JP) .......................... 2002-304966

(51) Int. Cl.$^7$ .............................................. H01L 41/08
(52) U.S. Cl. ...................... 310/358; 310/320; 310/366; 310/368
(58) Field of Search .............................. 310/320, 358, 310/359, 366, 368

(56) References Cited

U.S. PATENT DOCUMENTS 3,955,109 A * 5/1976 Comparini et al. ......... 310/360
6,717,335 B2 * 4/2004 Nishimura et al. ......... 310/364

FOREIGN PATENT DOCUMENTS

JP    5-243889    9/1993
JP    7-147527    6/1995
JP    7-226647    8/1995

* cited by examiner

*Primary Examiner*—Mark Budd
(74) *Attorney, Agent, or Firm*—Keating & Bennett, LLP

(57) ABSTRACT

A piezoelectric shear resonator has a substantially rectangular-column piezoelectric element that excites a shear-vibration mode and that has opposing substantially rectangular shear strain surfaces. The shear strain surfaces each have an aspect ratio at which the electromechanical coupling factor reaches substantially a maximum value. When the vertical dimension of the shear strain surfaces is D and the horizontal dimension thereof is Le, the aspect ratio Le/D is expressed by $Le/D = \{\alpha \cdot (S_{44}^E/S_{33}^E)^{1/2} + \beta\} \pm 0.3$, where $S_{44}^E$ and $S_{33}^E$ are elastic compliances, $\alpha = 0.27 \cdot n + 0.45$, $\beta = 1.09 \cdot n + 0.31$, and n is a positive integer.

14 Claims, 21 Drawing Sheets

US 6,967,432 B2

PIEZOELECTRIC SHEAR RESONATOR, COMPOSITE PIEZOELECTRIC SHEAR RESONATOR, AND PIEZOELECTRIC RESONATOR COMPONENT

BACKGROUND OF THE INVENTION

1. Field of the Invention

The present invention relates to piezoelectric shear resonators and composite piezoelectric shear resonators. More specifically, the present invention relates to a piezoelectric shear resonator for use, for example, as a vibrating member in a composite piezoelectric shear resonator and also relates to a composite piezoelectric shear resonator, except an energy-trap resonator, using the piezoelectric shear resonator as a vibrating member.

The present invention further relates to composite piezoelectric shear resonators and piezoelectric resonator components. More particularly, the present invention relates to a composite piezoelectric shear resonator having a configuration in which vibrations propagating to a reflective layer from a vibrating member are reflected at an interface between the reflective layer and a holding member and also relates to a piezoelectric resonator component including the composite piezoelectric shear resonator.

2. Description of the Related Art

Piezoelectric resonators for use as a piezoelectric oscillator or a bandpass filter (BPF) are disclosed in, for example, Japanese Unexamined Patent Application Publications Nos. H5-243889 and H7-147527. A thickness-shear piezoelectric vibrating element disclosed in the publication No. H5-243889 has a configuration in which excitation electrodes are provided on two opposing major surfaces of a $LiTaO_3$ piezoelectric substrate. This piezoelectric vibrating element is characterized in that the relationship between the overlapping length of the opposing excitation electrodes and the thickness of the piezoelectric substrate is adjusted within an appropriate range to inhibit an unwanted ripple that is generated in the vicinity of the resonant frequency.

Meanwhile, a piezoelectric resonator disclosed in the publication No. H7-147527 has a configuration in which resonance electrodes are arranged to oppose each other on two longer side major surfaces of a piezoelectric element having rectangular surfaces, and is characterized in that the ratio of the length of the longer-side edge to the length of the shorter-side edge is adjusted in relation to Poisson's ratio. With such a piezoelectric resonator, adopting a certain length ratio allows for an improvement in the energy-trapping efficiency of a resonating portion, thus providing an advantage in that miniaturization of the piezoelectric resonator can be achieved.

Meanwhile, what is disclosed in the publication No. H5-243889 is a so-called typical "energy-trapping piezoelectric shear resonator". Such a configuration, however, makes it difficult to provide a thickness-shear resonator having a large specific band (i.e., the ratio of the passband width to the center frequency). Energy trapping typically refers to a vibration phenomenon in which vibration energy is concentrated in the vicinity of the overlapping portion of excitation electrodes. The piezoelectric shear resonator having the above-described configuration is not suitable for miniaturization since it involves a large amount of area for providing a vibration damping region, i.e., a region between a vibrating portion to a non-vibrating portion.

In contrast, while the piezoelectric shear resonator disclosed in the publication No. H7-147527 is also an energy-trapping resonator, it allows for further miniaturization compared to a typical energy-trapping resonator since the energy-trapping efficiency is substantially improved. In practice, however, even such a piezoelectric shear resonator cannot provide an increased specific band.

SUMMARY OF THE INVENTION

In order to overcome the problems described above, preferred embodiments of the present invention provide a piezoelectric shear resonator that is capable of increasing the specific band, and a composite piezoelectric shear resonator that uses the piezoelectric shear resonator as a vibrating member and that can achieve miniaturization. It is to be noted, however, that the composite piezoelectric shear resonator herein has a configuration other than an energy-trapping resonator.

In addition, preferred embodiments of the present invention provide a composite piezoelectric shear resonator that can achieve miniaturization without adversely affecting vibration characteristics and that is stable due to a small frequency change and a large specific band, and also provide a piezoelectric resonator component that includes such a novel composite piezoelectric shear resonator.

According to a preferred embodiment of the present invention, a piezoelectric shear resonator includes a substantially rectangular-column piezoelectric element that has substantially rectangular shear strain surfaces and that excites a shear vibration mode. The shear strain surfaces have an aspect ratio at which an electromechanical coupling factor k reaches substantially a maximum value. Thus, the piezoelectric shear resonator can utilize substantially a maximum value of the electromechanical coupling factor k, thus allowing an increase in the specific band of the piezoelectric shear resonator. As a result, it is possible to reduce variations in product quality and to achieve an improvement in resonator characteristics.

Preferably, the aspect ratio, which is the ratio Le/D of the vertical dimension D of the shear strain surfaces to the horizontal dimension Le thereof, is expressed by $Le/D = \{\alpha \cdot (S_{44}^E/S_{33}^E)^{1/2} + \beta\} \pm 0.3$, where $S_{44}^E$ and $S_{33}^E$ are elastic compliances, $\alpha = 0.27 \cdot n + 0.45$, $\beta = 1.09 \cdot n + 0.31$, and n is a integer. When such an aspect ratio Le/D based on the relationship described above is applied to a piezoelectric element, it is easy to use substantially the maximum value of the electromechanical coupling factor k in the piezoelectric shear resonator. As a result, it is possible to increase the specific band of the piezoelectric shear resonator.

Preferably, excitation electrodes are arranged to oppose each other on two major surfaces of the piezoelectric element which are substantially perpendicular to the shear strain surfaces and that are substantially parallel to the shear direction of the piezoelectric element. A ratio L/Le, L being the overlapping length L of the excitation electrodes and Le being the horizontal dimension Le of the shear strain surfaces, is expressed by $0.86 \leq L/Le \leq 1$. As long as such a relationship is satisfied, the frequency shift $dF_{OSC}/F_{OSC}$ shows little change even when the overlapping length of the excitation electrodes is changed. This makes it possible to prevent a frequency change in the piezoelectric shear resonator.

Preferably, a ratio W/D, W being the distance between the opposing shear strain surfaces and D being the horizontal dimension of the shear strain surfaces, is defined by any one of the relationships: $W/D \leq 1.2$, $1.3 \leq W/D \leq 1.5$, $1.7 \leq W/D \leq 2.0$, $2.2 \leq W/D \leq 2.5$, and $2.6 \leq W/D \leq 3.0$. When such a relationship is satisfied, the electromechanical coupling factor k of the piezoelectric shear resonator becomes large, which makes it possible to increase the specific band of the piezoelectric shear resonator.

According to another preferred embodiment of the present invention, a composite piezoelectric shear resonator including a piezoelectric shear resonator according to the preferred embodiment described above, wherein the piezoelectric shear resonator is used as a vibrating member and having a first acoustic impedance Z1, a reflective layer that is coupled with the vibrating member, the reflective layer having a second acoustic impedance Z2 that is lower than the first acoustic impedance Z1, and a holding member that is coupled with the reflective layer, the holding member having a third acoustic impedance Z3 that is higher than the second acoustic impedance Z2. Thus, vibrations propagating to the reflective layer from the vibrating member are reflected at the interface between the reflective layer and the holding member.

With this arrangement, the holding member is used to support the composite piezoelectric shear resonator without affecting the vibration characteristics of the vibrating member. Thus, this arrangement provides an improved advantage in that miniaturization can be achieved while increasing the specific band, compared to an energy-trapping-type resonator.

According to a further preferred embodiment of the present invention, a composite piezoelectric shear resonator includes a vibrating member that has a piezoelectric element for exciting a shear-vibration mode and excitation electrodes that are respectively provided on opposing major surfaces of the piezoelectric element, the vibrating member being made of a material having a first acoustic impedance Z1. The composite piezoelectric shear resonator further includes first and second reflective layers that are coupled with corresponding ends of the vibrating member, each reflective layer including material having a second acoustic impedance Z2 that is lower than the first acoustic impedance Z1, and first and second holding members that are coupled with corresponding ends of the first and second reflective layers, respectively, the ends being opposite to the ends with which the vibrating member is coupled, each second holding member including material having a third acoustic impedance Z3 that is higher than the second acoustic impedance Z2. Thus, vibrations propagating to the first and second reflective layers from the vibrating member are reflected at the interface between the first reflective layer and the first holding member and at the interface between the second reflective layer and the second holding member, respectively. With this arrangement, vibrations propagating to the reflective layer from the vibrating member are reflected at the interface between the reflective layer and the holding member. Thus, the composite piezoelectric shear resonator can be mechanically supported without adversely affecting the vibration characteristics of the vibrating member, and thus the entire configuration thereof can be miniaturized.

In addition, according to another preferred embodiment of the present invention, the distance Lr from the interface between the vibrating member and one of the reflective layers to the interface between the reflective layer and the corresponding one of the holding members is in the range of $n \cdot \lambda/4 \pm \lambda/8$, where $\lambda$ is the wavelength of vibrations generated only by the vibrating member and n is an odd number. The difference $|Lr1-Lr2|$ between a length Lr1, which is the length from the interface between the vibrating member and the first reflective layer to the interface between the first reflective layer and the first holding member, and a length Lr2, which is the length from the interface between the vibrating member and the second reflective layer to the interface between the second reflective layer and the second holding member, is in the range given by:

$$0.01 \leq |Lr1-Lr2|/(Lr1+Lr2) \leq 0.3.$$

With this arrangement, the resonant frequency experiences no or minimal change, which can provide an advantage in that the composite piezoelectric shear resonator has a small frequency change and thus is stabilized.

Preferably, the distance h from the interface between one of the reflective layers and the corresponding holding member to the outer end surface of the holding member is in the range of $n \cdot \lambda/4 \pm \lambda/8$, where $\lambda$ is the wavelength of vibrations generated only by the vibrating member and n is an odd number. The difference $|h1-h2|$ between a distance h1, which is the distance from the interface between the first reflective layer and the first holding member to the outer end surface of the first holding member, and a distance h2, which is the distance from the interface between the second reflective layer and the second holding member to the outer end surface of the second holding member, is in the range given by $0.01 \leq |h1-h2|/(h1+h2)$. With this arrangement, the resonant frequency experiences no or minimal change, which provides an advantage in that the composite piezoelectric shear resonator has a small frequency change and thus is stabilized.

Preferably, the holding members have a thickness T that is substantially the same as the vibrating member, and the ratio h/T of the distance h, h being the distance from the interface between one of the reflective layers and the corresponding holding member to the outer end surface of the holding member, to the thickness T is given by any one of the following relationships:

$$0.1 \times \alpha < h/T < 0.3 \times \alpha, \quad \text{(a)}$$

$$(0.5+1.6 \times n) \times \alpha < h/T < (0.8+1.6 \times n) \times \alpha, \text{ and} \quad \text{(b)}$$

$$(1.1+1.6 \times n) \times \alpha < h/T < (1.6+1.6 \times n) \times \alpha, \quad \text{(c)}$$

where $\alpha$ is a wave velocity ratio and is determined by dividing a wave velocity Cs in the one holding member by a wave velocity Cr in the vibrating member, thus $\alpha = Cs/Cr$, and n is a positive integer. Thus, setting the ratio h/T of the holding member of the composite piezoelectric shear resonator such that the electromechanical coupling factor k reaches substantially a maximum value can stabilize the composite piezoelectric shear resonator due to a larger specific band thereof. As a result, it is possible to reduce variations in product quality of the composite piezoelectric shear resonator, thus allowing an improvement in the filter characteristics.

Preferably, at least one of the holding members has a capacitance. Thus, this composite piezoelectric shear resonator has a circuit configuration in which a load capacitance, which is required in an oscillator circuit, is incorporated into the vibrating member. As a result, the composite piezoelectric shear resonator has an advantage in that the number of components is reduced.

According to another preferred embodiment of the present invention, a piezoelectric resonator component includes the composite piezoelectric shear resonator according to the above-described preferred embodiment of the present invention, a substrate that has a capacitance therein, and an outer packaging member. The composite piezoelectric shear resonator is provided on the substrate, and the outer packaging member is joined with the substrate so as to cover and seal the composite piezoelectric shear resonator.

With this arrangement, a piezoelectric resonator component having a capacitor substrate that has a highly reliable electrical connection with a composite piezoelectric shear resonator can be fabricated in a considerably easy manner. This can provide an advantage in that the piezoelectric resonator component can be efficiently mounted on a printed wiring board or other substrate via input/output terminals of the capacitor substrate.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Preferred embodiments of the present invention will be described below with reference to the accompanying drawings.

First Preferred Embodiment

Figure 1:
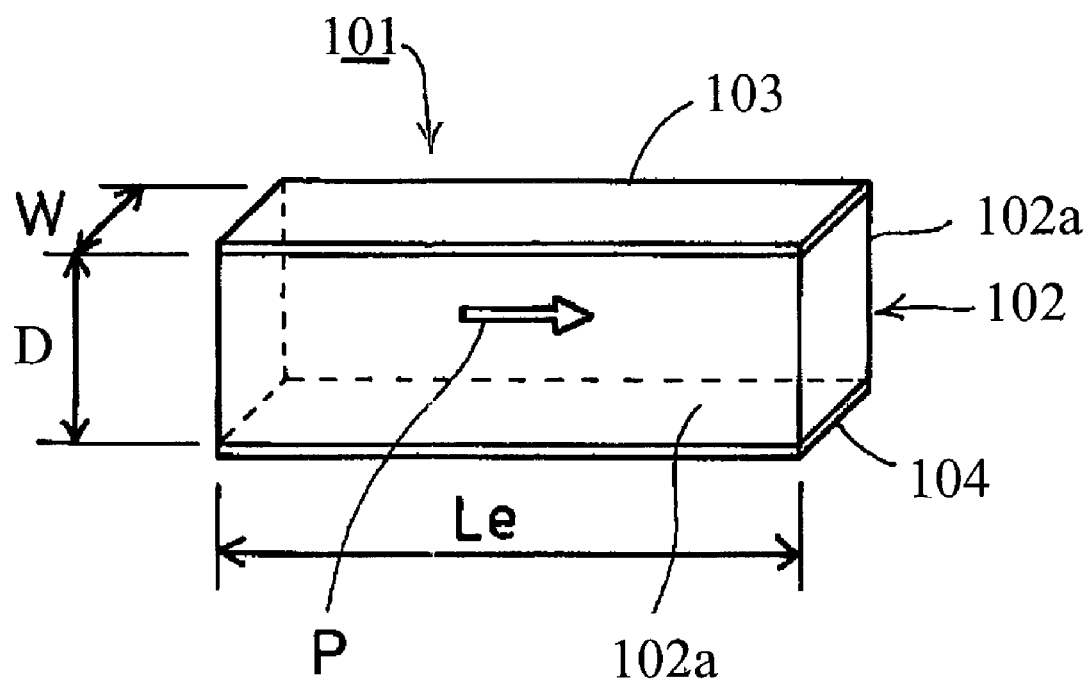
FIG. 1 is a perspective view schematically showing the configuration of a piezoelectric shear resonator according to a first preferred embodiment of the present invention.
Figure 2:
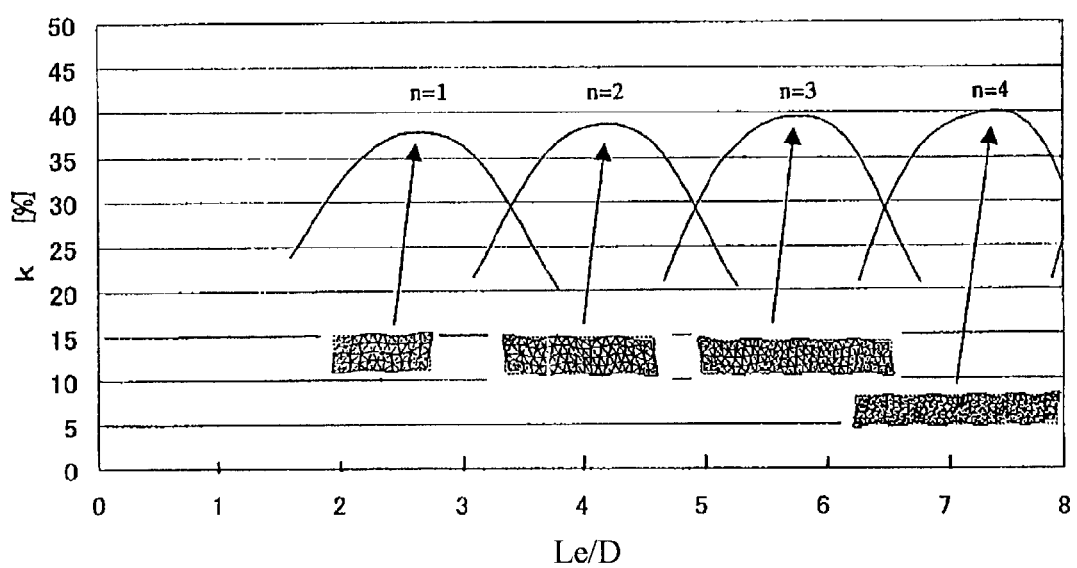
FIG. 2 is a graph showing the aspect ratio Le/D of shear strain surfaces versus an electromechanical coupling factor k.
Figure 3:
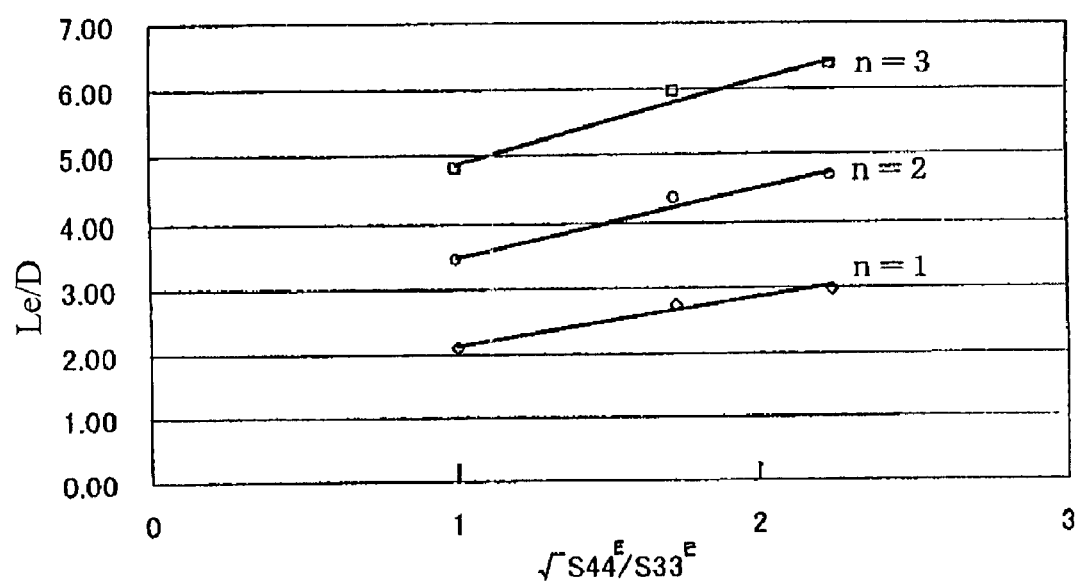
FIG. 3 is a graph showing the aspect ratio Le/D of the shear strain surfaces versus an elastic compliance $S_{44}^E/S_{33}^E$.
Figure 4:
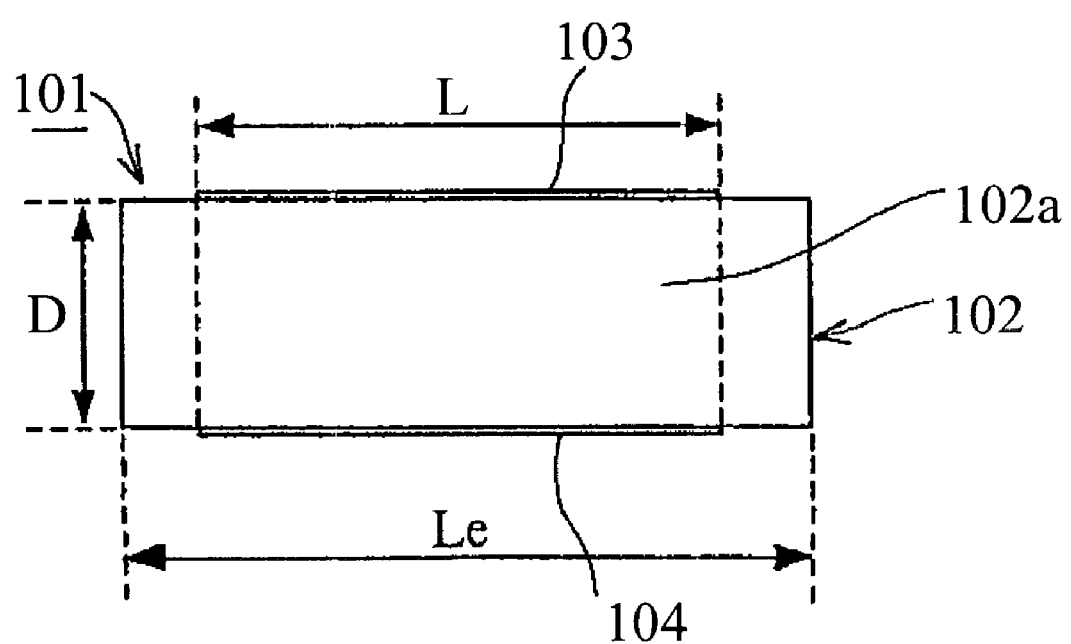
FIG. 4 is a side view schematically showing the configuration of the piezoelectric shear resonator.
Figure 5:
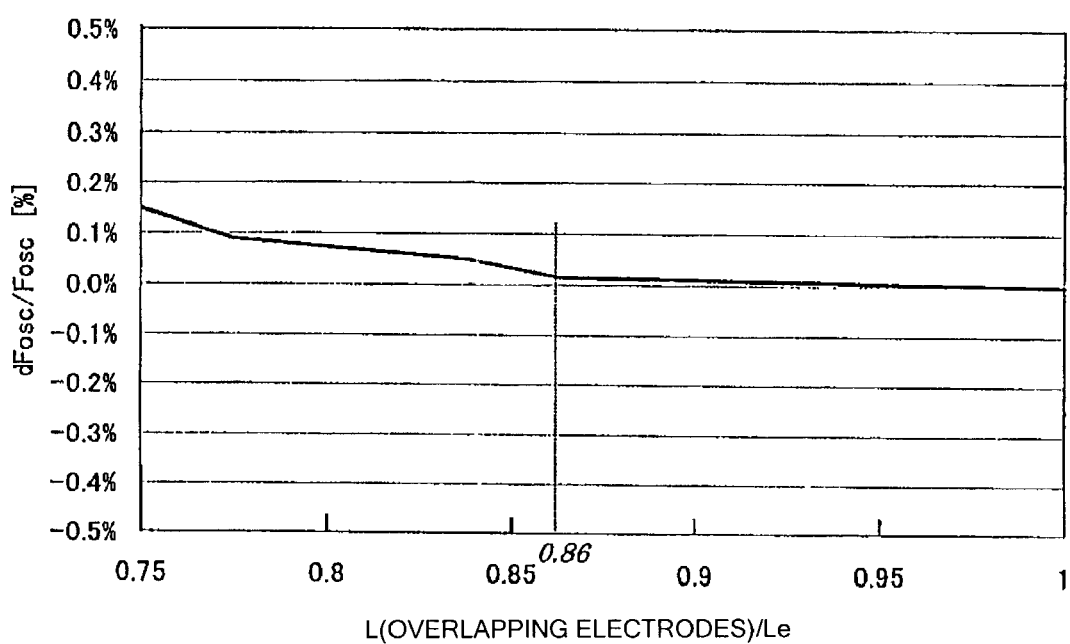
FIG. 5 is a graph showing a ratio L/Le, L being the overlapping length of opposing excitation electrodes and Le being the horizontal dimension of the shear strain surfaces, versus a frequency shift $dF_{OSC}/F_{OSC}$.
Figure 6:
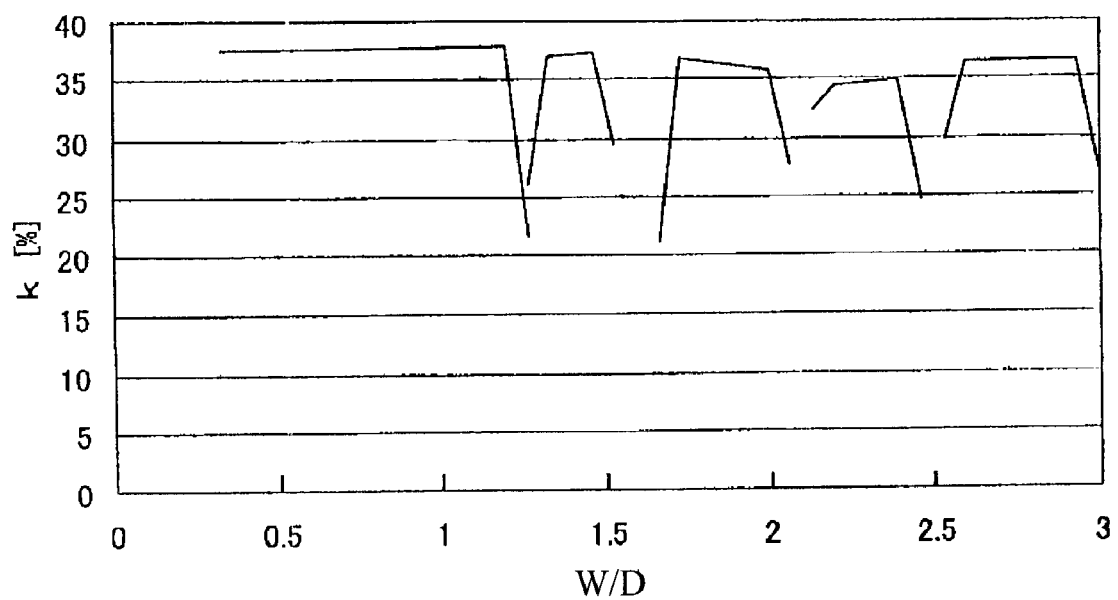
FIG. 6 is a graph showing a ratio W/D, W being the distance between the opposing shear strain surfaces and D being the horizontal dimension of the shear strain surfaces, versus the electromechanical coupling factor k.

FIG. 1 is a perspective view schematically showing the configuration of a piezoelectric shear resonator according to a first preferred embodiment of the present invention. FIG. 2 is a graph showing the aspect ratio Le/D of shear strain surfaces versus an electromechanical coupling factor k. FIG. 3 is a graph showing the aspect ratio Le/D of the shear strain surfaces versus an elastic compliance $S_{44}^E/S_{33}^E$. FIG. 4 is a side view schematically showing the configuration of the piezoelectric shear resonator. FIG. 5 is a graph showing a ratio L/Le, L being the overlapping length of opposing excitation electrodes and Le being the horizontal dimension of the shear strain surfaces, versus a frequency shift $dF_{OSC}/F_{OSC}$. FIG. 6 is a graph showing a ratio W/D, W being the distance between the opposing shear strain surfaces, i.e., the width dimension of the piezoelectric element, and D being the horizontal dimension of the shear strain surfaces, versus the electromechanical coupling factor k.

Reference numeral 101 in FIG. 1 indicates a piezoelectric shear resonator. This piezoelectric shear resonator 101 has a substantially rectangular-column piezoelectric element 102, which is preferably made of ceramic material, such as $LiTaO_3$ or $LiNbO_3$. The width dimension of the piezoelectric element 102 is denoted by W, and the vertical dimension and the horizontal dimension of shear strain surfaces 102a, which are substantially rectangular side-surfaces of the piezoelectric element 102, are denoted with D and Le, respectively. The piezoelectric element 102 is polarized in the axial direction (longitudinal direction) thereof, and the polarization direction is indicated by an arrow P in FIG. 1.

Further, excitation electrodes 103 and 104 are respectively provided on two major surfaces of the piezoelectric element 102, i.e., on the major surfaces that are substantially perpendicular to the shear strain surfaces 102a and that are substantially parallel to the shear direction of the piezoelectric element 102. When an AC voltage is applied across the opposing excitation electrodes 103 and 104, the piezoelectric substrate 102 vibrates in a thickness-shear vibration mode, thereby causing the piezoelectric shear resonator 101 to function.

Meanwhile, the inventors of the present invention determined the electromechanical coupling factor k of the piezoelectric shear resonator 101 while observing the aspect ratio Le/D of the shear strain surfaces 102a on the piezoelectric element 102. As a result, the present inventors found that there are relationships, as shown in FIG. 2, between the aspect ratio Le/D of the shear strain surfaces 102a and the electromechanical coupling factor k. Thus, from the results shown in FIG. 2, it is clear that the electromechanical coupling factor k of the piezoelectric shear resonator 101 periodically changes in relation to a change in the aspect ratio Le/D of the shear strain surfaces 102a even if the number n of vibration waves is any of one to four (n=1 to 4). It is also clear that the electromechanical coupling factor k reaches a maximum value in relation to a certain aspect ratio Le/D.

FIG. 2 includes schematic vertical sectional views illustrating displacement distributions, which are obtained from analysis using a finite element method, for respective numbers n of vibration waves in the piezoelectric shear resonator 101.

Thus, when the number n of vibration waves is one (n=1), the electromechanical coupling factor k displays the maximum value, i.e., about 38%, at an aspect ratio Le/D of about 2.6. Thus, configuring the piezoelectric shear resonator 101 such that it uses substantially the maximum value of the electromechanical coupling k can increase the specific band thereof. In such a case, the aspect ratio Le/D of the shear strain surfaces on the piezoelectric element 102 is pre-set so that the electromechanical coupling factor k reaches its maximum value. Thus, an increased specific band of the piezoelectric shear resonator 101 leads to a decrease in variations in product quality, which can achieve an improvement in resonator characteristics.

The present inventors also determined the aspect ratio Le/D of the shear strain surfaces 102a when the electromechanical coupling factor k displays its maximum value, while observing the material constants of the piezoelectric element 102. As a result, the inventors discovered the relationships shown in FIG. 3. Thus, when the number n of vibration waves is one (n=1), the aspect ratio Le/D is expressed by $Le/D = 0.72 \cdot (S_{44}^E/S_{33}^E)^{1/2} + 1.41$; when the number n is two (n=2), it is expressed by $Le/D = 1.00 \cdot (S_{44}^E/S_{33}^E)^{1/2} + 2.48$; and when the number n is three (n=3), it is expressed by $Le/D = 1.26 \cdot (S_{44}^E/S_{33}^E)^{1/2} + 3.59$, where $S_{44}^E$ and $S_{33}^E$ are elastic compliances which are determined according to the material of the piezoelectric element 102.

Analysis of these relationships indicated that the aspect ratio Le/D of the shear strain surfaces 102a when the electromechanical coupling factor k reaches its maximum value can be expressed by $Le/D = \alpha \cdot (S_{44}^E/S_{33}^E)^{1/2} + \beta$, where the value of the variable $\alpha$ is given by $\alpha = 0.27 \cdot n + 0.45$, the value of the variable $\beta$ is given by $\beta = 1.09 \cdot n + 0.31$, and n is a positive integer. Further, it has been empirically clarified that a tolerance of about ±0.3 is permitted with respect to the aspect ratio Le/D of the shear strain surfaces 102a. Thus, a general expression for the aspect ratio Le/D of the shear strain surfaces 102a when the electromechanical coupling factor k reaches its maximum value is defined as $Le/D = \{\alpha \cdot (S_{44}^E/S_{33}^E)^{1/2} + \beta\} \pm 0.3$.

Thus, the aspect ratio Le/D of the shear strain surfaces 102a when the electromechanical coupling factor k reaches its maximum value is determined in relation to the elastic compliances $S_{44}^E$ and $S_{33}^E$ and the number n of vibration waves. Accordingly, application of the aspect ratio Le/D, of the shear strain surface 102a, that is determined as described above to the piezoelectric element 102 facilitates the piezoelectric shear resonator 101 to use substantially the maximum value of the electromechanical coupling factor k. As a result, it is possible to increase the specific band of the piezoelectric shear resonator 101.

In addition, as shown in FIG. 4, the present inventors observed a change in the frequency shift $dF_{OSC}/F_{OSC}$ in relation to a change in the ratio L/Le, which is the ratio of the overlapping length L to the horizontal length Le of the shear strain surfaces 102a, while paying attention to the overlapping length L of the excitation electrodes 103 and 104, which are arranged so as to oppose each other on the major surfaces of the piezoelectric element 102. As a result, the inventors discovered a relationship as shown in FIG. 5. From the result shown in FIG. 5, it is clear that, when the ratio L/Le, which is the ratio of the overlapping length L of the excitation electrodes 103 and 104 to the horizontal dimension Le of the shear strain surfaces 102a, is in the range of about 0.86 to about 1, i.e., when the relationship $0.86 \leq L/Le \leq 1$ is satisfied, the frequency shift $dF_{OSC}/F_{OSC}$ experiences no or minimal change.

Thus, as long as the ratio L/Le of the overlapping length L, which is the length of the opposing and overlapping excitation electrodes 103 (shown at the upper side) and 104 (shown at the lower side), to the horizontal dimension Le of the shear strain surfaces 102a is in the range of about 0.86 to about 1, a frequency change in the piezoelectric shear resonator 101 remains small even when the overlapping length L of the excitation electrodes 103 and 104 is changed. In other words, as long as such a relationship is maintained, it is possible to prevent a frequency change in the piezoelectric shear resonator 101.

Furthermore, to determine the electromechanical coupling factor k, the present inventors examined a ratio W/D, W being the width dimension of the piezoelectric element 102 of the piezoelectric shear resonator 101, i.e., the distance between the opposing shear strain surfaces 102a and D being the horizontal dimension of the shear strain surfaces 102a. As a result, the inventors discovered the relationships shown in FIG. 6. Thus, from the results shown in FIG. 6, it can be seen that, as long as the ratio W/D, which is the ratio of the distance W between the opposing shear strain surfaces 102a to the horizontal dimension D of the shear strain surfaces 102a, is in the range given by any of the relationships $W/D \leq 1.2$, $1.3 \leq W/D \leq 1.5$, $1.7 \leq W/D \leq 2.0$, $2.2 \leq W/D \leq 2.5$, and $2.6 \leq W/D \leq 3.0$, the electromechanical coupling factor k of the piezoelectric shear resonator 101 becomes large.

Second Preferred Embodiment

Figure 7:
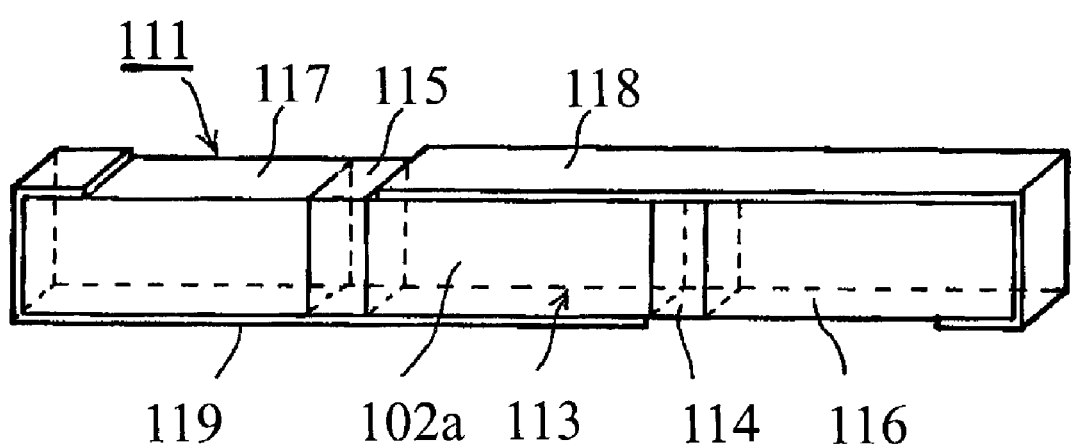
FIG. 7 is a perspective view schematically showing the configuration of a composite piezoelectric shear resonator according to a second preferred embodiment of the present invention.
Figure 8:
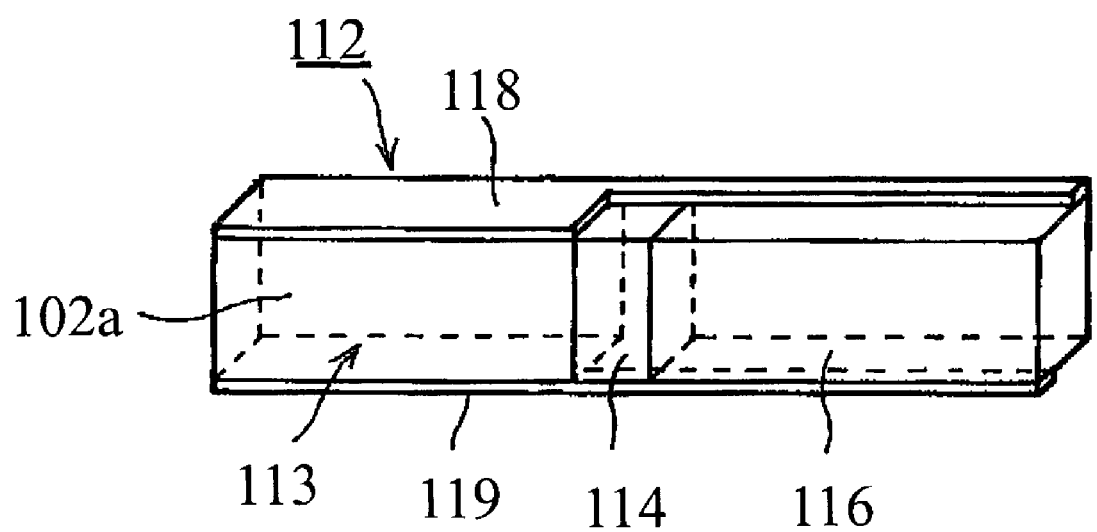
FIG. 8 is a perspective view schematically showing a modification of the second preferred embodiment of the present invention.

FIG. 7 is a perspective view schematically showing the configuration of a composite piezoelectric shear resonator according to a second preferred embodiment of the present invention, and FIG. 8 is a perspective view schematically showing the configuration according to a modification thereof. Reference number 111 in FIG. 7 indicates a composite piezoelectric shear resonator according to a second preferred embodiment, and reference numeral 112 in FIG. 8 indicates a composite piezoelectric shear resonator according to a modification of the second preferred embodiment.

The composite piezoelectric shear resonator 111 according to the second preferred embodiment preferably has a substantially rectangular-column vibrating member 113, reflective layers 114 and 115 that are respectively coupled with the opposing end-surfaces of the vibrating member 113 in the axial direction (longitudinal direction), and holding members 116 and 117 that are respectively coupled with the outer end-surfaces of the reflective layers 114 and 115. In this preferred embodiment, the piezoelectric shear resonator 101 illustrated in the first preferred embodiment is used as the vibrating member 113. The piezoelectric element 102 of the vibrating member 113 is made of ceramic material having a first acoustic impedance Z1 of, for example, about $3.4 \times 10^7$ Kg/(m²·s), and is polarized in the axial direction.

Also, the reflective layers 114 and 115, which are coupled with the vibrating member 113, are each made of an epoxy resin having a second acoustic impedance Z2 of, for example, about $1.87 \times 10^6$ Kg/(m²·s), which is lower than the first acoustic impedance Z1 of the vibrating member 113. Further, the holding members 116 and 117 are each preferably made of ceramic material having a third acoustic impedance Z3 of, for example, about $3.4 \times 10^7$ Kg/(m²·s), i.e., an impedance higher than the second acoustic impedance Z2.

In addition, excitation electrodes 118 and 119 are respectively disposed on two major surfaces of the composite piezoelectric shear resonator 111, i.e., the two major surfaces that are substantially perpendicular to the shear strain surfaces 102a of the piezoelectric element 102 and that are substantially parallel to the shear direction of the piezoelectric element 102. One excitation electrode 118 (shown at the upper side) is integral with the upper major surface of the vibrating member 113 as well as the upper major surfaces of the reflective layer 114 and the holding member 116 which are coupled with one end surface (shown at the right side) of the vibrating member 113 in the longitudinal direction.

The other excitation electrode 119 (shown at the lower side) is integral with the lower major surface of the vibrating member 113 as well as the lower major surfaces of the reflective layer 115 and the holding member 117 which are coupled with the other end surface (shown at the left side) of the vibrating member 113 in the longitudinal direction. In FIG. 7, the excitation electrodes 118 and 119 are arranged to extend to the outer end surfaces of the holding members 116 and 117, respectively, but do not necessarily have to extend to the outer end surfaces of the holding members 116 and 117. Thus, naturally, the excitation electrodes 118 and 119 may be disposed only on the major surfaces.

In the composite piezoelectric shear resonator 111 having such a configuration, when an AC voltage is applied across the opposing excitation electrodes 118 and 119, which sandwich the piezoelectric element 102 of the vibrating member 113, the piezoelectric element 102 vibrates in a thickness-shear vibration mode. Vibrations that are generated by the vibrating member 113 propagate to the reflective layers 114 and 115, and are reflected at the interface between the reflective layer 114 and the holding member 116 and at the interface between the reflective layer and 115 and the holding members 117, respectively. As a result, vibrations that propagate to the holding members 116 and 117 are inhibited and also displacements due to the vibrations do not occur in the holding members 116 and 117, which thus can secure the support of the composite piezoelectric shear resonator 111 using the holding members 116 and 117.

Meanwhile, the composite piezoelectric shear resonator 111 according to the second preferred embodiment has a configuration in which the reflective layers 114 and 115 are coupled with the corresponding end surfaces of the vibrating member 113 and the holding members 116 and 117 are coupled with the corresponding reflective layers 114 and 115. The present invention, however, is not limited to such a configuration and thus may be applied to a composite piezoelectric shear resonator 112 as shown in FIG. 8. Specifically, the composite piezoelectric shear resonator 112 has a configuration in which the reflective layer 114 is coupled with only one end surface (shown at the right side) of the vibrating member 113 and the holding member 116 is coupled with the outer end surface of the reflective layer 114. In FIG. 8, the same reference numerals as those in FIG. 7 indicate the same elements and portions, the descriptions of which are omitted hereinafter.

In the composite piezoelectric shear resonator 112 according to this modification, similarly, the vibrating member 113 has a first acoustic impedance Z1 and the reflective layer 114 has a second acoustic impedance Z2 that is lower than the first acoustic impedance. The holding member 116 has a third acoustic impedance Z3 that is higher than the second acoustic impedance Z2. Thus, in the composite piezoelectric shear resonator 112, vibrations that are generated by the vibrating member 113 are reflected at the interface between the reflective layer 114 and the holding member 116, thus reducing vibrations that propagate to the holding member 116.

Third Preferred Embodiment

Figure 9:
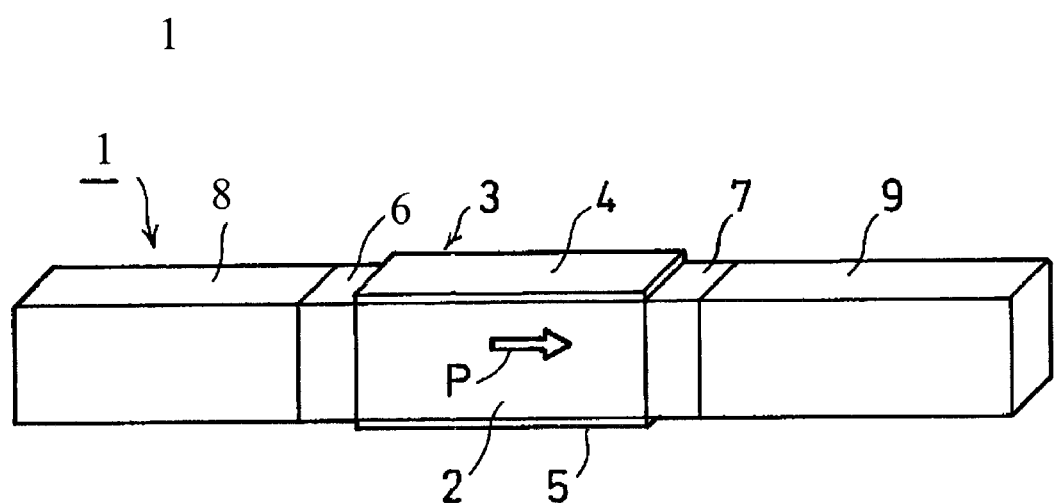
FIG. 9 is a perspective view schematically showing the overall structure of a composite piezoelectric shear resonator according to a third preferred embodiment of the present invention.
Figure 10:
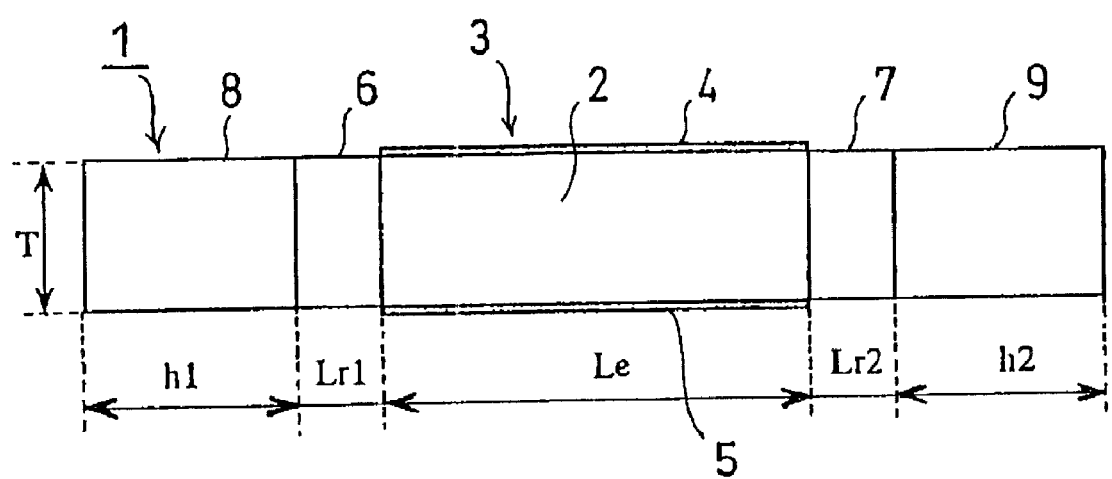
FIG. 10 is a side view of the structure shown in FIG. 9.
Figure 11:
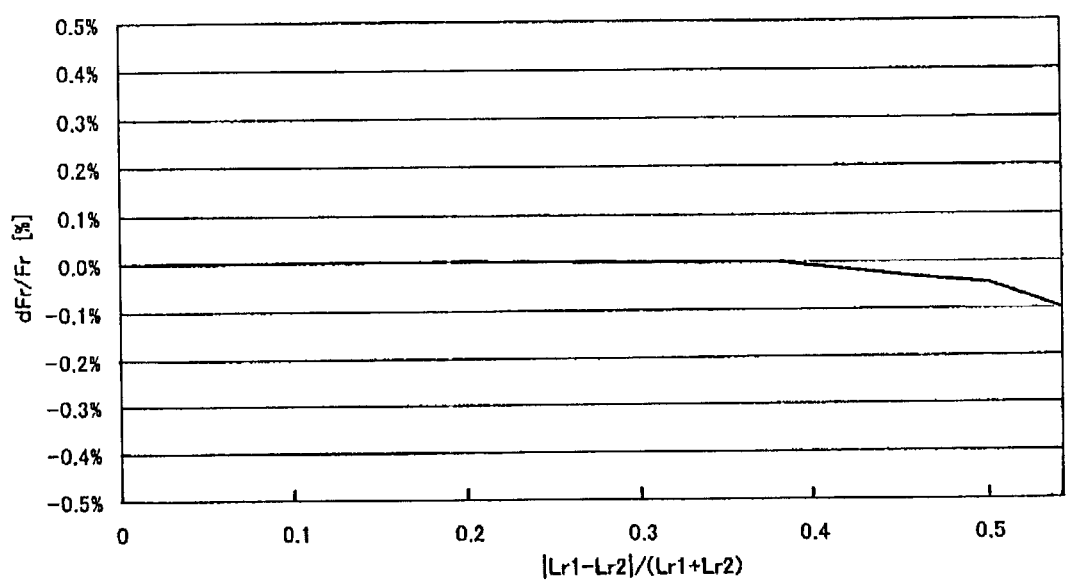
FIG. 11 is a graph showing a ratio |Lr1−Lr2|/(Lr1+Lr2), which is based on the difference between the lengths of the reflective layers of the composite piezoelectric shear resonator, versus the change ratio (the ratio of change) dFr/Fr of the resonant frequency Fr.
Figure 12:
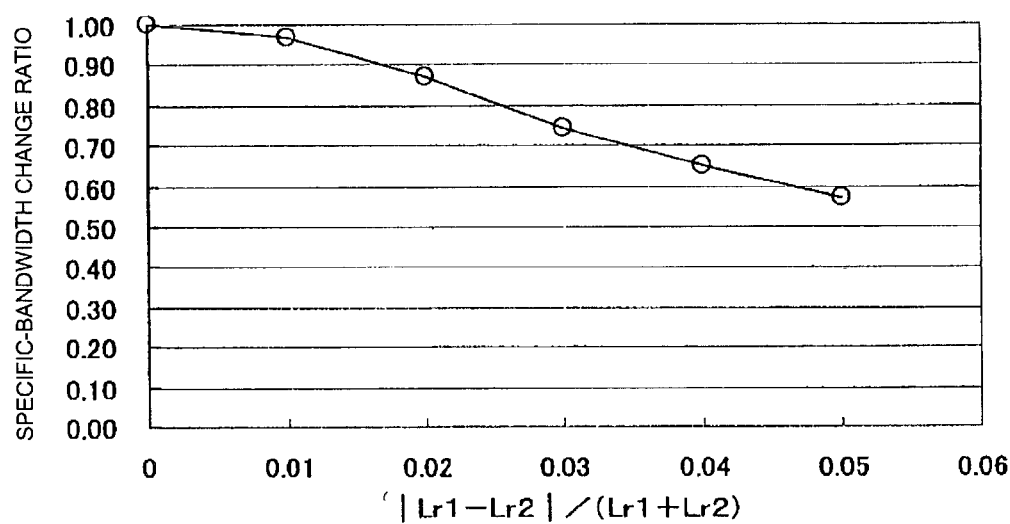
FIG. 12 is a graph showing the ratio |Lr1−Lr2|/(Lr1+Lr2), which is based on the difference between the lengths of the reflective layers, versus the specific-bandwidth change ratio (the ratio of change of the specific bandwidth) of a spurious vibration.
Figure 13:
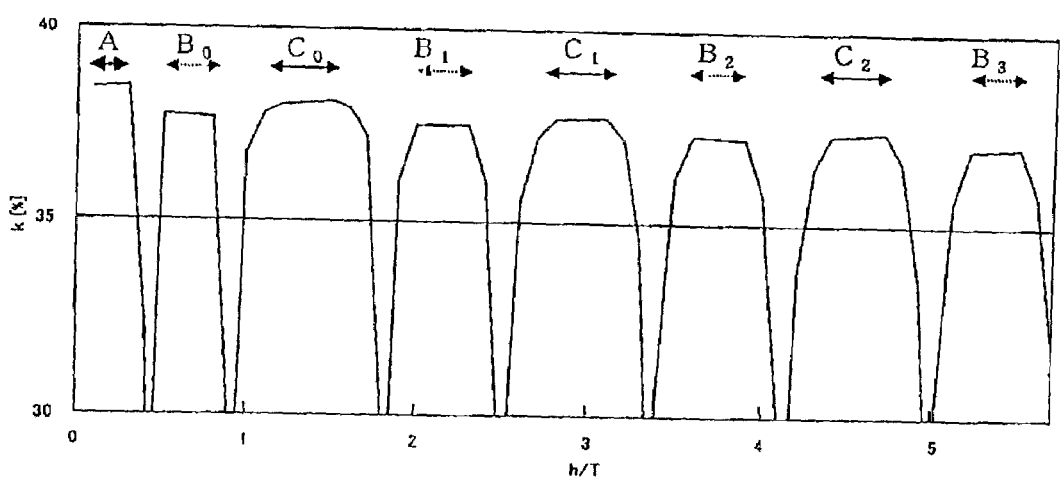
FIG. 13 is a graph showing a ratio h/T, h being the length of the holding members of the piezoelectric shear strain resonator and T being the thickness thereof, versus the electromechanical coupling factor k.

FIG. 9 is a perspective view schematically showing the entire structure of a composite piezoelectric shear resonator according to a third preferred embodiment of the present invention, and FIG. 10 is a side view thereof. FIG. 11 is a graph showing a ratio |Lr1−Lr2|/(Lr1+Lr2), which is based on the difference between the lengths of the reflective layers of the composite piezoelectric shear resonator, versus the ratio of change (hereinafter referred to as a "change ratio") dFr/Fr of the resonant frequency Fr. FIG. 12 is a graph showing the ratio |Lr1−Lr2|/(Lr1+Lr2) versus the specific-bandwidth change ratio (the ratio of change of the specific bandwidth) of a spurious vibration. FIG. 13 is a graph showing a ratio h/T, h being the length of the holding members of the piezoelectric shear strain resonator and T being the thickness thereof, versus the electromechanical coupling factor k.

Figure 14:
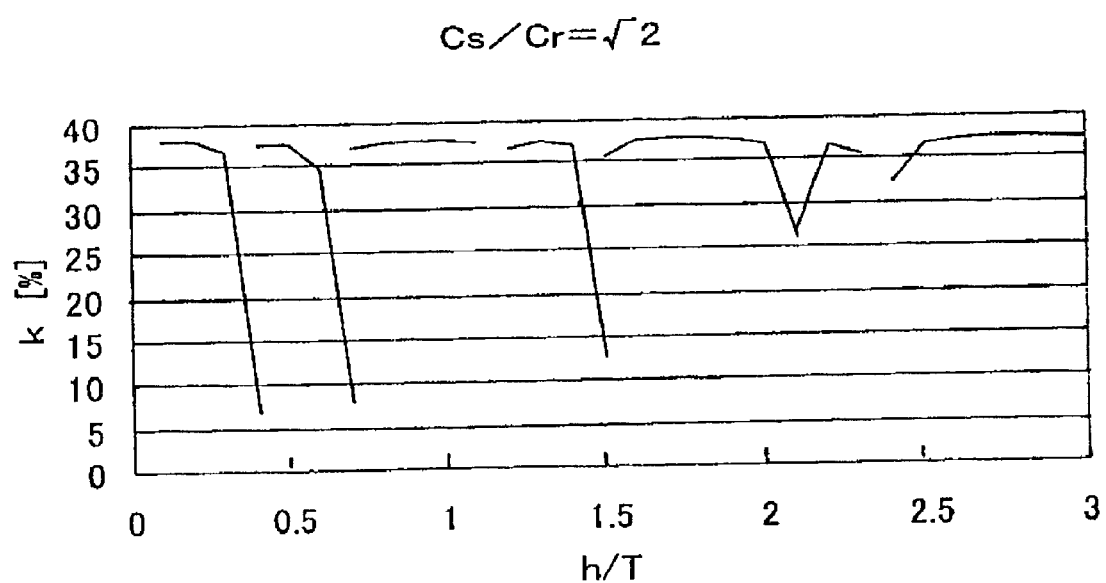
FIG. 14 is a graph showing the ratio h/T versus the electromechanical coupling factor k when the wave velocity ratio α is given by $\alpha = Cs/Cr = \sqrt{2}$.
Figure 15:
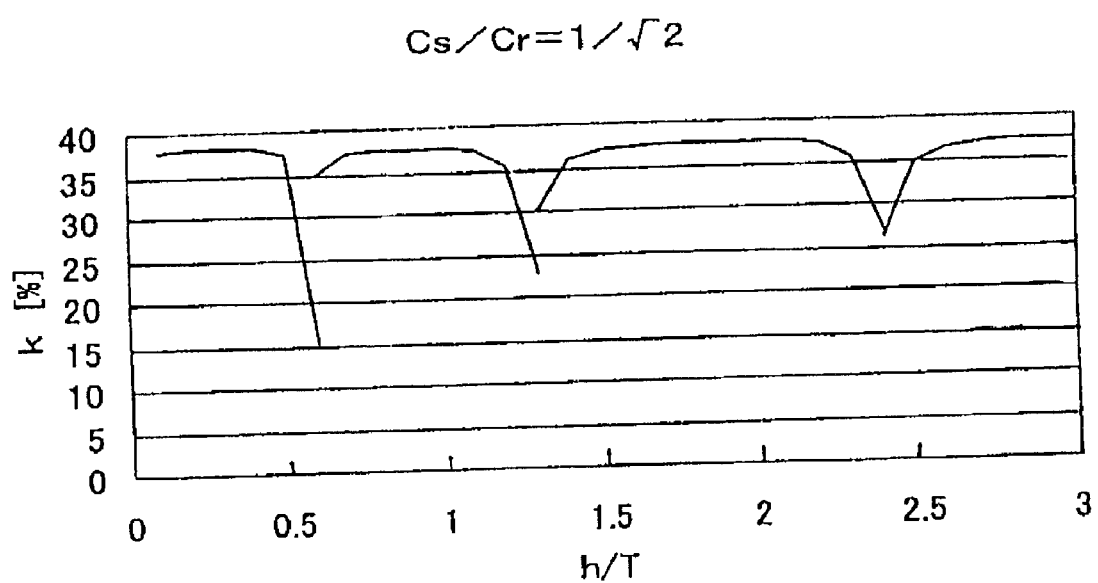
FIG. 15 is a graph showing the ratio h/T versus the electromechanical coupling factor k when the wave velocity ratio α is given by $\alpha = Cs/Cr = 1/\sqrt{2}$.
Figure 16:
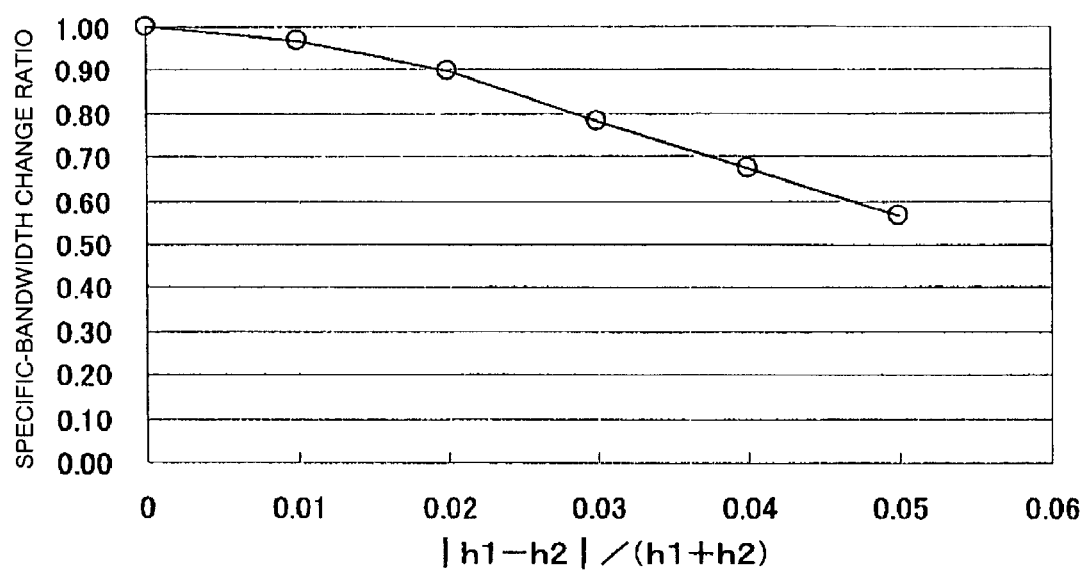
FIG. 16 is a graph showing a ratio |h1−h2|/(h1+h2), which is based on the difference between the lengths of the holding members, versus the specific-bandwidth change ratio of a spurious vibration.

FIG. 14 is a graph showing the ratio h/T versus the electromechanical coupling factor k when the wave velocity ratio α is given by α=Cs/Cr=√2. FIG. 15 is a graph showing the ratio h/T versus the electromechanical coupling factor k when the wave velocity ratio α is given by α=Cs/Cr=1/√2. FIG. 16 is a graph showing the ratio |h1−h2|/(h1+h2), which is based on the difference between the lengths of the holding members, versus the specific-bandwidth change ratio of a spurious vibration. Reference numeral 1 in FIGS. 9 and 10 indicates a composite piezoelectric shear resonator.

The composite piezoelectric shear resonator 1 has a vibrating member 3, which includes a substantially rectangular-column piezoelectric element 2. The piezoelectric element 2 is preferably made of a material having a first acoustic impedance Z1, for example, lead titanate based ceramics having an acoustic impedance Z1 of about $3.4 \times 10^7$ Kg/(m²·s). The piezoelectric element 2 is polarized such that the polarization direction P matches with the axial direction (longitudinal direction) thereof. Excitation electrodes 4 and 5 are also disposed on the respective opposing major surfaces of the piezoelectric element 2.

Thus, the vibrating member 3 in this case has a configuration in which the excitation electrodes 4 and 5 are disposed on the corresponding major surfaces of the piezoelectric element 2, which excites a shear mode. When an AC voltage is applied across the opposing excitation electrodes 4 and 5, which sandwich the piezoelectric element 2, the vibrating member 3 vibrates in a thickness-shear vibration mode. In FIG. 10, Le indicates the length (the horizontal distance) of the vibrating member 3 and T indicates the thickness thereof.

Also, reflective layers 6 and 7 are coupled with the corresponding end surfaces of the vibrating member 3 in the axial direction thereof. The reflective layers 6 and 7 are each made of an epoxy resin having a second acoustic impedance Z2 of, for example, about $1.87 \times 10^6$ Kg/(m$^2$·s), which is lower than the first acoustic impedance Z1 of the vibrating member 3. In this case, the lengths (horizontal distances) of the reflective layers 6 and 7 may be different from each other, and the length of the reflective layer 6 is indicated by Lr1 and the length of the reflective layer 7 is indicated by Lr2.

In other words, in FIG. 10, the distance between the interface between the vibrating member 3 and the reflective layer 6 to the interface between the reflective layer 6 and a holding member 8 (described later) is designated by Lr1, and the distance from the interface between the vibrating member 3 and the reflective layer 7 to the interface between the reflective layer 7 and a holding member 9 (described later) is designated by Lr2. Naturally, the lengths Lr1 and Lr2 may be the same (Lr1=Lr2).

Meanwhile, when λ is the wavelength of vibrations generated only by the vibrating member 3, the lengths Lr, i.e., the lengths Lr1 and Lr2, of the reflective layers 6 and 7 are each preferably within the range of n·λ/4±λ/8, preferably, in the vicinity of λ/4, where n is an odd number. The wavelength λ of vibrations generated by the vibrating member 3 can be expressed by $\lambda = 1/f \times \sqrt{(E/\rho)}$, where f is the frequency of vibrations generated by the vibrating member 3, E is the Young's modulus of the holding members 8 and 9, and ρ is the density of the holding members 8 and 9.

Further, the holding members 8 and 9 are coupled with corresponding outer end-surfaces of the reflective layers 6 and 7, i.e., with the end surfaces that are opposite to the surfaces with which the vibrating member 3 is coupled. The holding members 8 and 9 are each made of ceramic material having a third acoustic impedance Z3 of, for example, about $3.4 \times 10^7$ Kg/(m$^2$·s), which is higher than the second acoustic impedance Z2 of the reflective layers 6 and 7. Similarly to the reflective layers 6 and 7, these holding members 8 and 9 have a thickness T that is substantially the same as the vibrating member 3.

The length of the holding member 8, i.e., the distance from the interface between the reflective layer 6 and the holding member 8 to the outer end surface of the holding member 8 is indicated by h1. The length of the holding member 9, which is coupled with the reflective layer 7, i.e., the distance from the interface between the reflective layer 7 and the holding member 9 to the outer end surface of the holding member 9 is indicated by h2. Naturally, the distance h1 and the distance h2 may be the same.

In the composite piezoelectric shear resonator 1, as described above, the second acoustic impedance of the reflective layers 6 and 7 is lower than either of the first acoustic impedance Z1 of the vibrating member 3 and the third acoustic impedance Z3 of the holding members 8 and 9. Thus, vibrations propagating to the reflective layers 6 and 7 from the vibrating member 3 are reflected at the interface between the reflective layer 6 and the holding member 8 and at the interface between the reflective layer 7 and the holding member 9, respectively. This makes it possible to mechanically support the composite piezoelectric shear resonator 1 via the holding members 8 and 9 without adversely affecting the vibration characteristics of the vibrating member 3.

In addition, with this configuration, there is no need to provide a vibration-damping portion having a relatively large area outside the piezoelectric vibration section. Thus, unlike the case of an energy-trapping piezoelectric shear resonator, the composite piezoelectric shear resonator of this preferred embodiment does not have a problem in that the overall size thereof is increased due to an increased length dimension. This makes it possible to achieve miniaturization compared to an energy-trapping piezoelectric shear resonator.

Incidentally, the inventors of the present invention observed the reflective layers 6 and 7, which are coupled with the corresponding end surfaces of the vibrating member 3, to determine the relationship between the ratio |Lr1−Lr2|/(Lr1+Lr2), which is based on the difference between the lengths Lr1 and Lr2 of the reflective layers 6 and 7, and the change ratio dFr/Fr (%) of the resonant frequency Fr. As a result, the inventors discovered a relationship shown in FIG. 11. Thus, the consideration in this case is to examine the effect of the difference between the lengths Lr1 and Lr2 of the pair of left and right reflective layers 6 and 7, provided in the composite piezoelectric shear resonator 1 shown in FIG. 10, on the resonant frequency Fr.

From the results shown in FIG. 11, it can be seen that, as long as the ratio |Lr1−Lr2|, which is based on the difference between the lengths Lr1 and Lr2 of the reflective layers 6 and 7, is preferably in the range in which the relationship $0.01 \leq |Lr1-Lr2|/(Lr1+Lr2) \leq 0.3$ is satisfied, the change ratio dFr/Fr of the resonant frequency Fr is substantially 0% and thus, the resonant frequency Fr shows little change. Meanwhile, in the composite piezoelectric shear resonator 1 according to this preferred embodiment, except for vibrations generated only by the vibrating member 3, a vibration mode in which the reflective layers 6 and 7 and the holding members 8 and 9 integrally resonate exists at twice the resonant frequency of the vibrating member 3. This vibration mode, however, is an unwanted response. In order to weaken such a response, it is desired to arrange the reflective layers 6 and 7 such that the lengths thereof are different from each other.

Further, in this case, it is preferable to set the range |Lr−Lr2|, which is based on the difference between the lengths Lr1 and Lr2 of the reflective layers 6 and 7, to be in the range in which the expression $0.01 \leq |Lr1-Lr2|/(Lr1+Lr2)$ is satisfied. This is because, as shown in FIG. 12, as the difference between the lengths Lr1 and Lr2 is increased, the specific-bandwidth change ratio of a spurious vibration generated in response to the resonance of the reflective layers 6 and 7 and holding members 8 and 9 is reduced. Thus, adoption of a configuration in which the relationship given by the above expression is satisfied can provide a composite piezoelectric shear resonator 1 that has a small frequency change and that is stable.

In addition, the inventors observed the holding members 8 and 9, which were coupled with the corresponding reflective layers 6 and 7 and had a thickness T, of the composite piezoelectric shear resonator 1, to determine the relationship between the ratio h/T and the mechanical coupling factor k (%). In this case, the length h (=h1=h2) was changed while the ends of the holding members 8 and 9 were fixed. FIG. 13 shows the results. In this case, Cr is a wave velocity in the material of the vibrating member 3 and Cs is a wave velocity in the material of the holding members 8 and 9. Further, α is a wave velocity ratio, which is determined by dividing the wave velocity Cs by the wave velocity Cr (i.e., α=Cs/Cr), and α=1 in this case.

From these results, it is clear that, even when the length h of the holding members 8 and 9 are changed, as shown in FIG. 13, three ranges (consecutive ranges A to C) in which the electromechanical coupling factor k displays a maximum value exist. Specifically, it is shown in FIG. 13 that 0.1<h/

T<0.3 is given in range A, (0.5+1.6×n)<h/T<(0.8+1.6×n) is given in range B, and (1.1+1.6×n)<h/T<(1.6+1.6×n) is given in range C.

In this case, n represents the number of vibration waves and is a positive integer. While the distances h1 and h2 of the holding members 8 and 9 were equal (h1=h2) during the examination it was also confirmed that, even when the distances h1 and h2 were different from each other (h1≠h2), the same results were obtained as long as the lengths h1 and h2 were within the three ranges described above.

Additionally, the inventors of the present invention made a further examination and found that the range of the ratio h/T at which the electromechanical coupling factor k displays a maximum value is in proportion to the wave velocity ratio α. That is, for example, when the wave velocity ratio α is given by αCs/Cr=√2, the result shown in FIG. 14 is provided, and when it is given by α=Cs/Cr=1/√2, the result shown in FIG. 15 is provided.

Now, the ratio h/T at which the electromechanical coupling factor k displays its maximum value is summarized into the following general expressions:

$0.1 \times \alpha < h/T < 0.3 \times \alpha$,      Range A:

$(0.5+1.6 \times n) \times \alpha < h/T < (0.8+1.6 \times n) \times \alpha$,      Range B:

and $(1.1+1.6 \times n) \times \alpha < h/T < (1.6+1.6 \times n) \times \alpha$.      Range C:

Thus, when the ratio h/T of the holding members 8 and 9 of the composite piezoelectric shear resonator 1 is set so that the electromechanical coupling factor k reaches substantially its maximum value, the composite piezoelectric shear resonator 1 has an increased specific band and is stabilized. Thus, an increased specific band of the composite piezoelectric shear resonator 1 leads to a decrease in variations in product quality, which can achieve an improvement in filter characteristics.

As described above, the composite piezoelectric shear resonator 1 of this preferred embodiment includes the vibrating member 3, reflective layers 6 and 7 that are coupled with the end surfaces of the vibrating member 3, and the holding members 8 and 9 that are coupled with the corresponding reflective layers 6 and 7. In the composite piezoelectric shear resonator 1, the distance Lr from the interfaces between the vibrating member 3 and the reflective layers 6 and 7 to the corresponding interfaces of the reflective layers 6 and 7 and the holding members 8 and 9 is in the range of n·λ/4±λ/8 (n is an odd number), where λ is the wavelength of vibrations generated only by the vibrating member 3. In addition, in this case, when the distance from the interface between the vibrating member 3 and the reflective layer 6 to the interface between the interface between the reflective layer 6 and the holding member 8 is Lr1 and the distance from the interface between the vibrating member 3 and the reflective layer 7 to the interface between the reflective layer 7 and the holding member 9 is Lr2, the range of the difference |Lr1−Lr2| between the distances Lr1 and Lr2 has a relationship given by: $0.01 \leq |Lr1-Lr2|/(Lr1+Lr2) \leq 0.3$.

The present invention, however, is not limited to the configuration of this particular preferred embodiment, and may be applied to a composite piezoelectric shear resonator 1 having the following configuration. Thus, in the same configuration as in the composite piezoelectric shear resonator 1 of the third preferred embodiment in which the vibrating member 3, the reflective layers 6 and 7, and the holding members 8 and 9 are integrally coupled, the distance h from the interfaces of the reflective layers 6 and 7 between the holding members 8 and 9 to the outer end surfaces of the corresponding holding members 8 and 9 may be set to be in the range of n·λ/4±λ/8, preferably, in the vicinity of λ/4, where λ is the wavelength of vibrations generated only by the vibrating member 3 and n is an odd number.

In this composite piezoelectric shear resonator 1, when the length or distance from the interface between the reflective layer 6 and the holding member 8 to the outer end surface of the holding member 8 is h1 and the length or distance from the interface between the reflective layer 7 and the holding member 9 to the outer end surface of the holding member 9 is h2, the range of the difference |h1−h2| between the distances h1 and h2 has a relationship given by $0.01 \leq |h1-h2|/(h1+h2)$. As long as this relationship is satisfied, the resonant frequency Fr shows little change as in the third preferred embodiment.

With such a composite piezoelectric shear resonator 1, however, a vibration mode in which the reflective layers 6 and 7 and the holding members 8 and 9 integrally resonate exists at twice the resonant frequency of the vibrating member 3. Thus, in order to weaken the unwanted response, it is desired to arrange the holding members 8 and 9 such that the lengths thereof are different from each other. Additionally, it has been confirmed that setting the ratio |h1−h2|, which is based on the difference between the lengths h1 and h2 of the holding members 8 and 9, to be in the range of $0.01 \leq |h1-h2|/(h1+h2)$ provides a decreased specific-bandwidth change ratio of the spurious vibration generated in response to the resonance of the reflective layers 6 and 7 and the holding members 8 and 9, as shown in FIG. 6.

Fourth Preferred Embodiment

Figure 17:
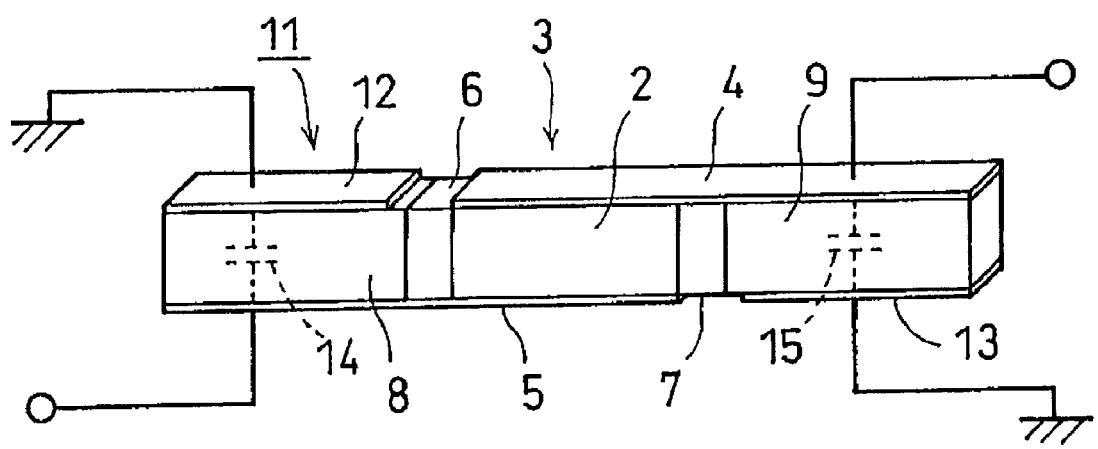
FIG. 17 is a perspective view schematically showing the overall structure of a composite piezoelectric shear resonator according to a fourth preferred embodiment of the present invention.
Figure 18:
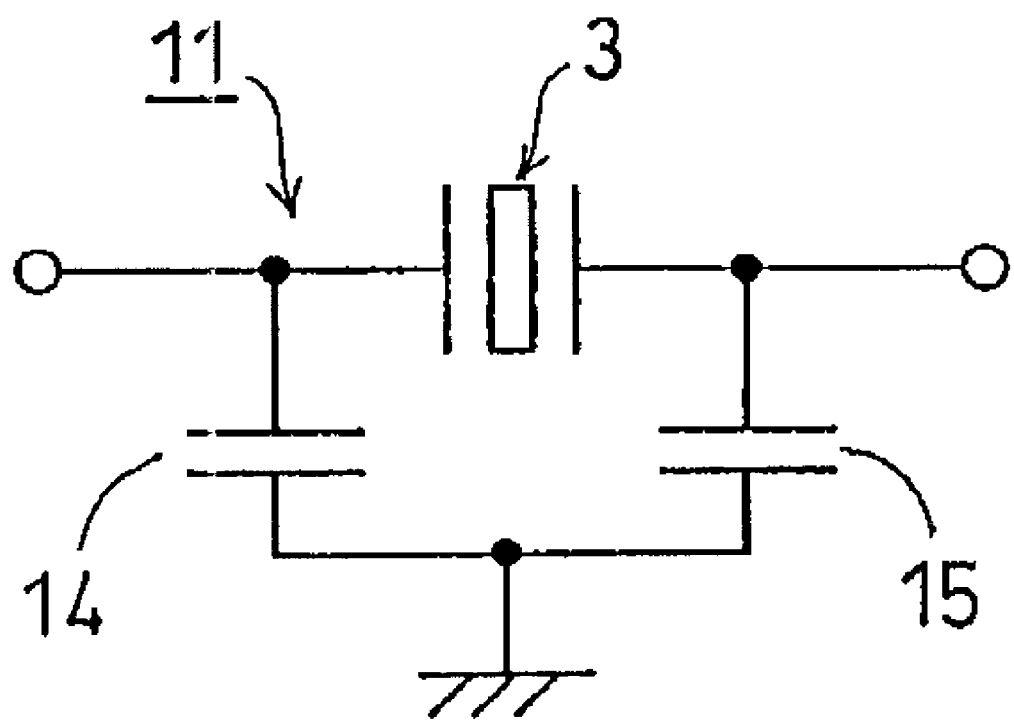
FIG. 18 is an equivalent circuit diagram of the structure shown in FIG. 17.
Figure 19:
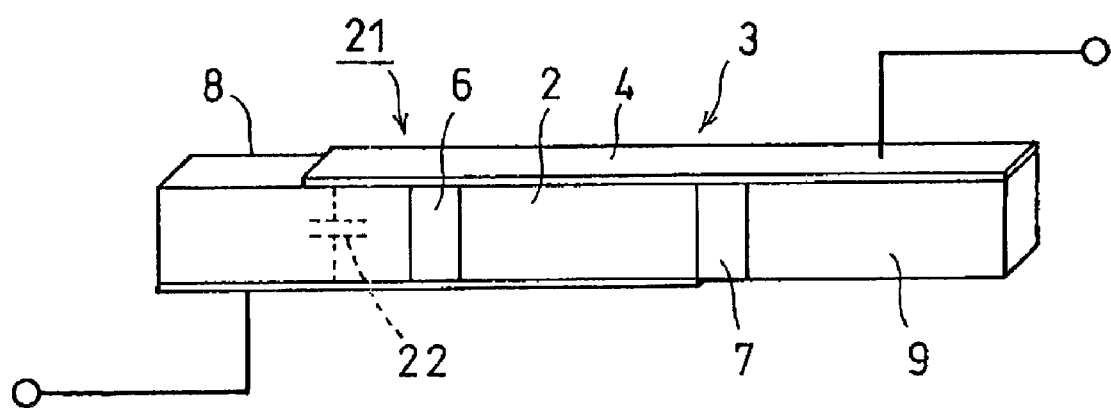
FIG. 19 is a perspective view schematically showing the overall structure of a composite piezoelectric shear resonator according to a modification of the fourth preferred embodiment of the present invention.
Figure 20:
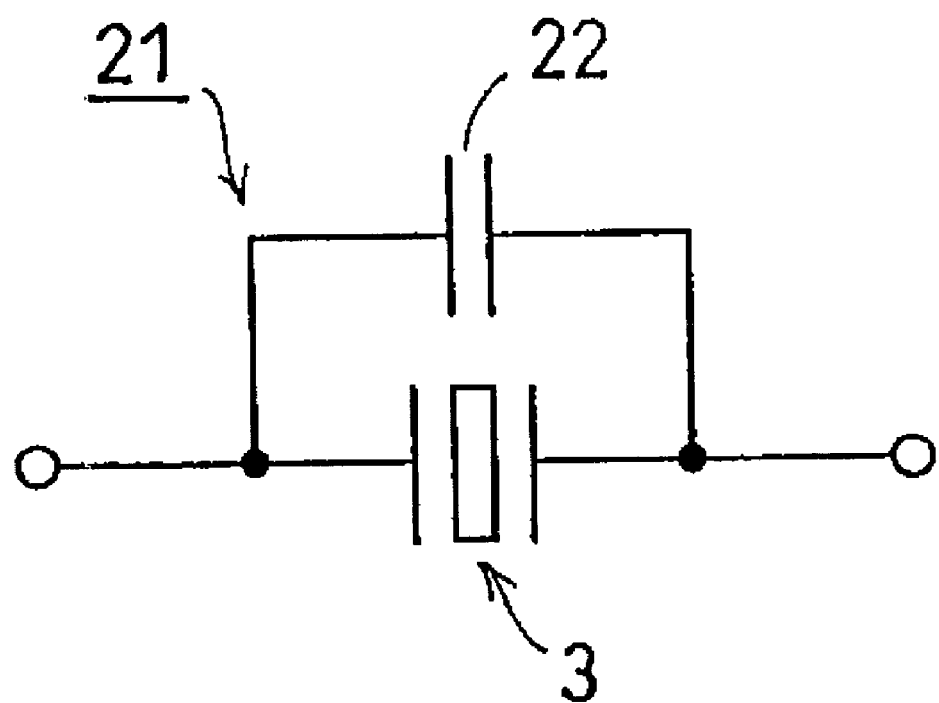
FIG. 20 is an equivalent circuit diagram of the structure shown in FIG. 19.

FIG. 17 is a perspective view schematically showing the overall structure of a composite piezoelectric shear resonator according to a fourth preferred embodiment of the present invention, and FIG. 18 is an equivalent circuit diagram thereof. FIG. 19 is a perspective view schematically showing the overall structure of a composite piezoelectric shear resonator according to a modification of the fourth preferred embodiment shown in FIG. 19, and FIG. 20 is an equivalent circuit diagram of the modification. Reference numeral 11 in FIGS. 17 and 18 indicates a composite piezoelectric shear resonator, and reference numeral 21 in FIGS. 19 and 20 also indicates a composite piezoelectric shear resonator. In FIGS. 17 to 20, the same reference numerals as those in FIGS. 9 to 16 indicate the same elements and portions, the detailed descriptions of which are omitted hereinafter.

A composite piezoelectric shear resonator 11 according to the fourth preferred embodiment has a substantially rectangular-column piezoelectric element 2, a pair of left and right reflective layers 6 and 7 that are coupled with the end surfaces of the piezoelectric element 2 in the axial direction (longitudinal direction) thereof, and a pair of left and right holding members 8 and 9 that are coupled with the corresponding outer end surfaces of the reflective layers 6 and 7. The piezoelectric element 2 is preferably made of lead titanate based ceramics having a first acoustic impedance of, for example, about $3.4 \times 10^7$ Kg/(m²·s). The piezoelectric element 2 is also polarized such that the polarization direction P matches with the axial direction of the piezoelectric element 2. Excitation electrodes 4 and 5 are disposed on the opposing major surfaces of the piezoelectric element 2. Further, the excitation electrode 4 disposed on the upper major surface of the piezoelectric element 2 extends to the upper major surfaces of the reflective layer 7 and the holding member 9 which are coupled with the right end surface of the piezoelectric element 2.

Also, the excitation electrode 5 disoposed on the lower major surface of the piezoelectric element 2 extends to the lower major surfaces of the reflective layer 6 and the holding member 8 which are coupled with the left end surface of the piezoelectric element 2. In addition, terminal electrodes 12 and 13 are disposed on the upper major surface of the holding member 8 and the lower major surface of the holding member 9, respectively. Thus, one terminal electrode 12 opposes the excitation electrode 5 with the holding member 8 interposed therebetween, that is, the one terminal electrode 12 and the excitation electrode 5 sandwich the holding member 8, so that a capacitance 14 is substantially provided in the holding member 8.

Similarly, the other terminal electrode 13 opposes the excitation electrode 4 with the holding member 9 interposed therebetween, that is, the terminal electrode 13 and the excitation electrode 4 sandwich the holding member 9, so that a capacitance 15 is substantially provided-in the holding member 9. The composite piezoelectric shear resonator 11 according to the fourth preferred embodiment has capacitances 14 and 15 within the corresponding holding members 8 and 9, which are coupled with the end surfaces of the piezoelectric element 2 with the corresponding reflective layers 6 and 7 interposed therebetween. That is, the composite piezoelectric shear resonator 11 has a configuration as shown in the equivalent circuit diagram of FIG. 18, i.e., a configuration in which the load capacitances 14 and 15, which are required in an oscillator circuit, are incorporated into the vibrating member 3. As a result, it is possible to realize a reduction in component count.

Since the piezoelectric element 2 in the composite piezoelectric shear resonator 11 has excitation electrodes 4 and 5 on the opposing major surfaces, the piezoelectric element 2 functions as the vibrating member 3 in the third preferred embodiment Thus, when an AC voltage is applied across the excitation electrodes 4 and 5, the vibrating member 3 vibrates in a thickness-shear vibration mode. In this case, since the second acoustic impedance Z2 of the reflective layers 6 and 7 is lower than either of the first acoustic impedance Z1 of the vibrating member 3 and the third acoustic impedance Z3 of the holding members 8 and 9, vibrations propagating to the reflective layers 6 and 7 from the vibrating member 3 are reflected at the interface between the reflective layer 6 and the holding member 8 and at the interface between the reflective layer 7 and the holding member 9, respectively Meanwhile, in the composite piezoelectric shear resonator 11, the excitation electrode 4 disposed on the upper major surface of the piezoelectric element 2 extends to the upper major surfaces of the reflective layer 7 and the holding member 9, and the excitation electrode 5 disposed on the lower major surface of the piezoelectric element 2 extends to the lower major surfaces of the reflective layer 6 and the holding member 8. Further, the terminal electrodes 12 and 13 are disposed on the upper major surface of the holding member 8 and the lower major surface of the holding member 9, respectively. However, as in the composite piezoelectric shear resonator 21 illustrated as a modification of the fourth preferred embodiment in FIG. 19, without forming the terminal electrodes 12 and 13, the excitation electrode 4 disposed on the upper major surface of the piezoelectric element 2 may extend to the upper major surfaces of the reflective layers 6 and 7 and the holding member 8 and the excitation electrode 5 disposed on the lower major surface of the piezoelectric element 2 may extend to the lower major surfaces of the reflective layer 6 and the holding member 8.

When such a configuration is adopted, since the excitation electrode 4 opposes the excitation electrode 5 with the holding member interposed therebetween, a capacitance 22 is substantially formed in the holding member 8. Thus, the composite piezoelectric shear resonator 21 according to the modification has configuration shown in the equivalent circuit diagram of FIG. 20, i.e., a circuit configuration in which the capacitance 22 is incorporated in parallel with the vibrating member 3. As a result, it is possible to change the specific band of the vibrating member 3 by adjusting the capacitance 22, which thus can control the oscillation frequency.

Fifth Preferred Embodiment

Figure 21:
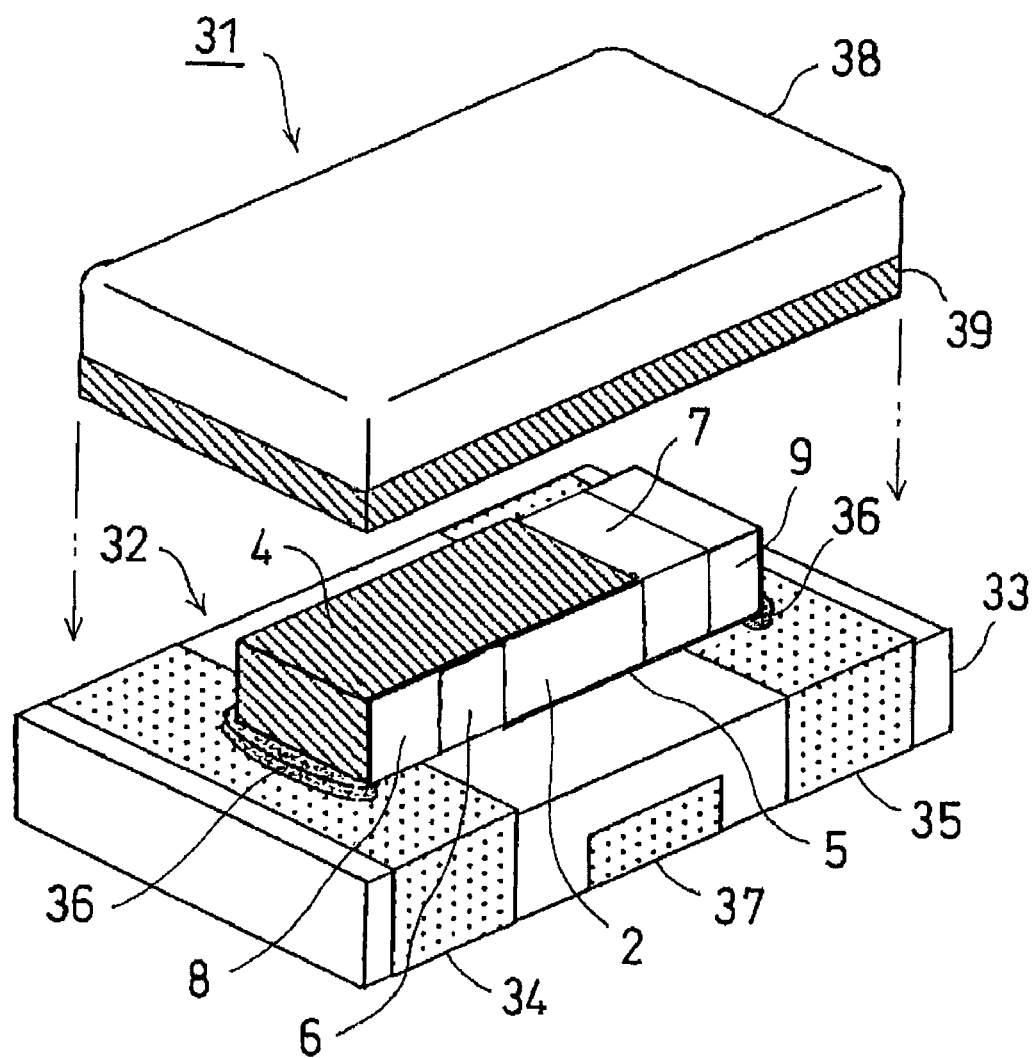
FIG. 21 is an exploded perspective view schematically showing the overall structure of a piezoelectric resonator component according to a fifth preferred embodiment of the present invention.

FIG. 21 is an exploded perspective view schematically showing the overall structure of a piezoelectric resonator component according to a fifth preferred embodiment of the present invention. Reference numeral 31 in FIG. 21 indicates a piezoelectric resonator component. The piezoelectric resonator component 31 according to this preferred embodiment has a configuration using one of the composite piezoelectric shear resonators 1, 11, and 21 shown in the fourth and fifth preferred embodiments.

In a composite piezoelectric shear resonator 32 in this preferred embodiment, for example, the excitation electrode 4 disposed on the upper major surface of the piezoelectric element 2 of the composite piezoelectric shear resonator 1 (11, or 21) extends to the outer end surface of the holding member 8 via the upper major surfaces of the reflective layer 6 and the holding member 8. Similarly, the excitation electrode 5 disposed on the lower major surface of the piezoelectric element 2 extends to the outer end surface of the holding member 9 via the lower major surfaces of the reflective layer 7 and the holding member 9.

The composite piezoelectric shear resonator 32, into which a capacitance is incorporated, are mounted on a so-called capacitor substrate 33, the excitation electrodes 4 and 5 are respectively connected with input/output electrodes 34 and 35, which are disposed at the capacitor substrate 33, with solder 36. Reference numeral 37 in FIG. 21 indicates a ground electrode that is disposed at the capacitor substrate 33.

A cap 38, which is an outer packaging member for covering the composite piezoelectric shear resonator 32, is joined with the capacitor substrate 33 via an insulating adhesive 39, thereby sealing the composite piezoelectric shear resonator 32 that is mounted on the capacitance substrate 33. The cap 38 is preferably made of a conductive material, such as aluminum or stainless steel. Thus, the cap 38 provides the composite piezoelectric shear resonator 32 with electromagnetic shielding. In this case, naturally, the cap 38, which seals the composite piezoelectric shear resonator 32, has an internal volume that does not inhibit vibrations.

What is claimed is:

1. A piezoelectric shear resonator comprising:
   a substantially rectangular-column piezoelectric element that has substantially rectangular shear strain surfaces and that excites a shear vibration mode, the shear strain surfaces having an aspect ratio at which an electromechanical coupling factor k reaches substantially a maximum value; wherein the aspect ratio, which is the ratio Le/D of the vertical dimension D of the shear strain surfaces to the horizontal dimension Le thereof, is expressed by:

$$Le/D = \{\alpha \cdot (S_{44}^E/S_{33}^E)^{1/2} + \beta\} \pm 0.3$$

where $S_{44}^E$ and $S_{33}^E$ are elastic compliances, $\alpha = 0.27 \cdot n + 0.45$, $\beta = 1.09 \cdot n + 0.31$, and n is an integer.

2. The piezoelectric shear resonator according to claim 1, wherein excitation electrodes are arranged to oppose each other on two major surfaces of the piezoelectric element which are substantially perpendicular to the shear strain surfaces and that are substantially parallel to the shear direction of the piezoelectric element, and a ratio L/Le, L being the overlapping length L of the excitation electrodes and Le being the horizontal dimension Le of the shear strain surfaces, is expressed by $0.86 \leq L/Le \leq 1$.

3. The piezoelectric shear resonator according to claim 1, wherein a ratio W/D, W being the distance between the opposing shear strain surfaces and D being the horizontal dimension of the shear strain surfaces, is defined by at least one of the relationships:

$$W/D \leq 1.2, \quad (a)$$

$$1.3 \leq W/D \leq 1.5, \quad (b)$$

$$1.7 \leq W/D \leq 2.0, \quad (c)$$

$$2.2 \leq W/D \leq 2.5, \text{ and} \quad (d)$$

$$2.6 \leq W/D \leq 3.0. \quad (e)$$

4. A composite piezoelectric shear resonator comprising:
the piezoelectric shear resonator according to claim 1, the piezoelectric shear resonator defining a vibrating member and having a first acoustic impedance Z1;
a reflective layer that is coupled with the vibrating member, the reflective layer having a second acoustic impedance Z2 that is lower than the first acoustic impedance Z1; and
a holding member that is coupled with the reflective layer, the holding member having a third acoustic impedance Z3 that is higher than the second acoustic impedance Z2,
wherein vibrations propagating to the reflective layer from the vibrating member are reflected at the interface between the reflective layer and the holding member.

5. A composite piezoelectric shear resonator comprising:
a vibrating member having a piezoelectric element for exciting a shear-vibration mode and excitation electrodes that are respectively provided on opposing major surfaces of the piezoelectric element, the vibrating member being made of a material having a first acoustic impedance Z1;
first and second reflective layers that are coupled with corresponding ends of the vibrating member, each reflective layer being made of a material having a second acoustic impedance Z2 that is lower than the first acoustic impedance Z1; and
first and second holding members that are coupled with corresponding ends of the first and second reflective layers, respectively, the ends being opposite to the ends with which the vibrating member is coupled, each second holding member being made of a material having a third acoustic impedance Z3 that is higher than the second acoustic impedance Z2;
wherein vibrations propagating to the first and second reflective layers from the vibrating member are reflected at the interface between the first reflective layer and the first holding member and at the interface between the second reflective layer and the second holding member, respectively; and
wherein the distance Lr from the interface between the vibrating member and one of the reflective layers to the interface between the reflective layer and the corresponding one of the holding members is in the range of $n \cdot \lambda/4 \pm \lambda/8$, where $\lambda$ is the wavelength of vibrations generated only by the vibrating member and n is an odd number, and the difference $|Lr1-Lr2|$ between a length Lr1, which is the length from the interface between the vibrating member and the first reflective layer to the interface between the first reflective layer and the first holding member, and a length Lr2, which is the length from the interface between the vibrating member and the second reflective layer to the interface between the second reflective layer and the second holding member, is in the range given by:

$$0.01 \leq |Lr1-Lr2|/(Lr1+Lr2) \leq 0.3.$$

6. The composite piezoelectric shear resonator according to claim 5, wherein the distance h from the interface between one of the reflective layers and the corresponding holding member to the outer end surface of the holding member is in the range of $n \cdot \lambda/4 \pm \lambda/8$, where $\lambda$ is the wavelength of vibrations generated only by the vibrating member and n is an odd number, and the difference $|h1-h2|$ between a distance h1, which is the distance from the interface between the first reflective layer and the first holding member to the outer end surface of the first holding member, and a distance h2, which is the distance from the interface between the second reflective layer and the second holding member to the outer end surface of the second holding member, is in the range given by:

$$0.01 \leq |h1-h2|/(h1+h2).$$

7. The composite piezoelectric shear resonator according to claim 5, wherein the holding members have a thickness T substantially the same as the vibrating member, and the ratio h/T of the distance h, h being the distance from the interface between one of the reflective layers and the corresponding holding member to the outer end surface of the holding member, to the thickness T is given by any one of the following relationships:

$$0.1 \times \alpha < h/T < 0.3 \times \alpha, \quad (a)$$

$$(0.5+1.6 \times n) \times \alpha < h/T < (0.8+1.6 \times n) \times \alpha, \text{ and} \quad (b)$$

$$(1.1+1.6 \times n) \times \alpha < h/T < (1.6+1.6 \times n) \times \alpha, \quad (c)$$

where $\alpha$ is a wave velocity ratio and is determined by dividing a wave velocity Cs in the one holding member by a wave velocity Cr in the vibrating member, thus $\alpha = Cs/Cr$, and n is a positive integer.

8. The composite piezoelectric shear resonator according to claim 5, wherein at least one of the holding members has a capacitance.

9. A piezoelectric resonator component comprising:
the composite piezoelectric shear resonator according to claim 5;
a substrate that has a capacitance therein; and
an outer packaging member;
wherein the composite piezoelectric shear resonator is provided on the substrate, and the outer packaging member is joined with the substrate so as to cover and seal the composite piezoelectric shear resonator.

10. A piezoelectric shear resonator comprising:
a substantially rectangular-column piezoelectric element that has substantially rectangular shear strain surfaces and that excites a shear vibration mode, the shear strain surfaces having an aspect ratio, which is the ratio Le/D of the vertical dimension D of the shear strain surfaces to the horizontal dimension Le thereof, is expressed by:

$$Le/D = \{\alpha \cdot (S_{44}^E/S_{33}^E)^{1/2} + \beta\} \pm 0.3,$$

where $S_{44}^E$ and $S_{33}^E$ are elastic compliances, $\alpha = 0.27 \cdot n + 0.45$, $\beta = 1.09 \cdot n + 0.31$, and n is an integer.

11. The piezoelectric shear resonator according to claim 10, wherein the aspect ratio is a value at which an electromechanical coupling factor k reaches substantially a maximum value.

12. The piezoelectric shear resonator according to claim 10, wherein excitation electrodes are arranged to oppose each other on two major surfaces of the piezoelectric element which are substantially perpendicular to the shear strain surfaces and that are substantially parallel to the shear direction of the piezoelectric element, and a ratio L/Le, L being the overlapping length L of the excitation electrodes and Le being the horizontal dimension Le of the shear strain surfaces, is expressed by $0.86 \leq L/Le \leq 1$.

13. The piezoelectric shear resonator according to claim 10, wherein a ratio W/D, W being the distance between the opposing shear strain surfaces and D being the horizontal dimension of the shear strain surfaces, is defined by at least one of the relationships:

| | |
|---|---|
| $W/D \leq 1.2$, | (a) |
| $1.3 \leq W/D \leq 1.5$, | (b) |
| $1.7 \leq W/D \leq 2.0$, | (c) |
| $2.2 \leq W/D \leq 2.5$, and | (d) |
| $2.6 \leq W/D \leq 3.0$. | (e) |

14. A composite piezoelectric shear resonator comprising:
the piezoelectric shear resonator according to claim 10, the piezoelectric shear resonator defining a vibrating member and having a first acoustic impedance Z1;
a reflective layer that is coupled with the vibrating member, the reflective layer having a second acoustic impedance Z2 that is lower than the first acoustic impedance Z1; and
a holding member that is coupled with the reflective layer, the holding member having a third acoustic impedance Z3 that is higher than the second acoustic impedance Z2,
wherein vibrations propagating to the reflective layer from the vibrating member are reflected at the interface between the reflective layer and the holding member.

* * * * *